United States Patent
Matsuyama (10) Patent No.: US 8,008,616 B2
(45) Date of Patent: Aug. 30, 2011

(54) INTERRUPTER

(75) Inventor: Hiroshi Matsuyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 477 days.

(21) Appl. No.: 12/275,317

(22) Filed: Nov. 21, 2008

(65) Prior Publication Data

US 2009/0128794 A1    May 21, 2009

(30) Foreign Application Priority Data

Nov. 21, 2007 (JP) .................. 2007-301457

(51) Int. Cl.
*H01J 40/14* (2006.01)
(52) U.S. Cl. ........... 250/239; 250/551; 257/81; 257/433
(58) Field of Classification Search .................. 250/239, 250/551; 257/80–82, 433, 434; 385/92, 385/94
See application file for complete search history.

(56) References Cited

U.S. PATENT DOCUMENTS

| 6,097,084 A | 8/2000 | Sano et al. |
| 6,459,099 B1 * | 10/2002 | Sano ................................. 257/82 |
| 6,677,580 B1 * | 1/2004 | Sano et al. .................... 250/239 |

FOREIGN PATENT DOCUMENTS

| JP | 08-335710 | 12/1996 |
| WO | 98/18168 | 4/1998 |

* cited by examiner

*Primary Examiner* — Kevin Pyo
(74) *Attorney, Agent, or Firm* — Turocy & Watson, LLP (57) ABSTRACT

An interrupter includes: a light emitting device; a light receiving device placed at a position on which light emitted from the light emitting device can be incident; and a mold member made of a material that transmits part of the light and absorbs the rest, including a section enclosing the light emitting device and a section enclosing the light receiving device, and having a gap between the light emitting device and the light receiving device. At least one of the thickness of the section of the mold member enclosing the light emitting device and the thickness of the section of the mold member enclosing the light receiving device is relatively thin in a region intervening in a linear light path from the light emitting device to the light receiving device, and is relatively thick in a surrounding region around said region.

20 Claims, 11 Drawing Sheets

HORIZONTAL

FIG. 8A

VERTICAL

INTERRUPTER

CROSS-REFERENCE TO RELATED APPLICATIONS

This application is based upon and claims the benefit of priority from the prior Japanese Patent Application No. 2007-301457, filed on Nov. 21, 2007; the entire contents of which are incorporated herein by reference.

BACKGROUND OF THE INVENTION

1. Field of the Invention

This invention relates to an interrupter.

2. Background Art

Transmissive (opposed-type) interrupters are used for sheet detection in printers and copiers, and to detect the lens position of digital cameras and cell phone cameras. A transmissive interrupter is a sensor composed of a light emitting device and a light receiving device placed opposite to each other. The transmissive interrupter senses the presence of a target to be detected with the help of the fact that the amount of light received by the light receiving device decreases when the target to be detected is interposed between the light emitting device and the light receiving device.

In the transmissive interrupter, the light emitting device and the light receiving device are enclosed with a mold member made of a resin material. The light emitting device and the light receiving device are placed so as to sandwich the space which the target to be detected may pass through, and held by a single mold member. Hence, the mold member typically has a square U shape. In the mold member, the portion intervening in the light path from the light emitting device to the light receiving device is formed from a transparent resin, and the other portion is formed from an opaque resin such as a black resin (see, e.g., JP-A-8-335710(Kokai) (paragraph 0021)).

With the recent downsizing and cost reduction of digital cameras and cell phones, components constituting them are also desired to be small and cost-effective. Naturally, further downsizing and cost reduction of the interrupter, with its resolution being maintained, are also desired.

SUMMARY OF THE INVENTION

According to an aspect of the invention, there is provided an interrupter including: a light emitting device; a light receiving device placed at a position on which light emitted from the light emitting device can be incident; and a mold member made of a material that transmits part of the light and absorbs the rest, including a section enclosing the light emitting device and a section enclosing the light receiving device, and having a gap between the light emitting device and the light receiving device, at least one of the thickness of the section of the mold member enclosing the light emitting device and the thickness of the section of the mold member enclosing the light receiving device being relatively thin in a region intervening in a linear light path from the light emitting device to the light receiving device, and being relatively thick in a surrounding region around said region.

According to another aspect of the invention, there is provided an interrupter including: a light emitting device; a light receiving device placed at a position on which light emitted from the light emitting device can be incident by being reflected by a target to be detected; and a mold member made of a material that transmits part of the light and absorbs the rest and including a section enclosing the light emitting device and a section enclosing the light receiving device, at least one of the thickness of the section of the mold member enclosing the light emitting device and the thickness of the section of the mold member enclosing the light receiving device being relatively thin in a region intervening in the optically shortest light path of light paths starting from the light emitting device, reflected by the target to be detected, and directed to the light receiving device, and being relatively thick in a surrounding region around said region.

DETAILED DESCRIPTION OF THE INVENTION

Embodiments of the invention will now be described with reference to the drawings, beginning with the description of a first embodiment of the invention.

Figure 1:
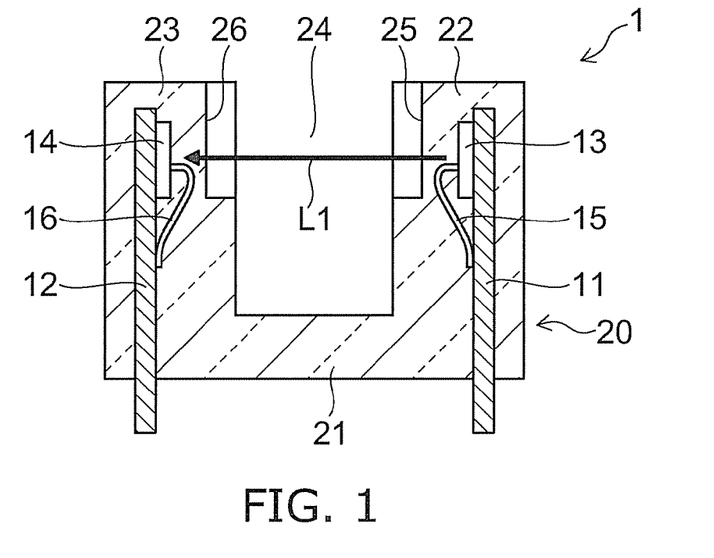
FIG. 1 is a cross-sectional view illustrating an interrupter according to a first embodiment of the invention.

FIG. 1 is a cross-sectional view illustrating an interrupter according to this embodiment.

Figure 2:
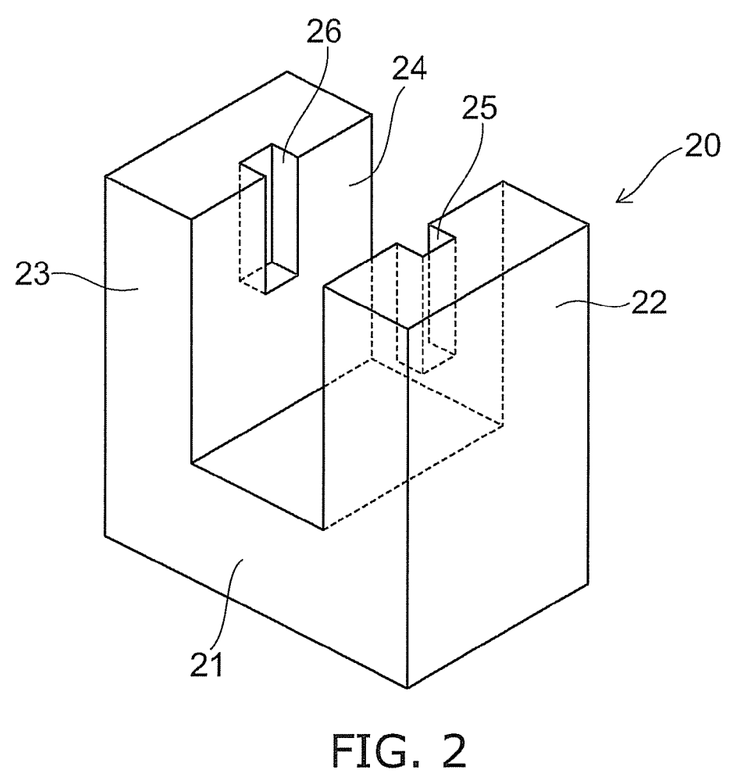
FIG. 2 is a perspective view illustrating a mold member of the interrupter according to the first embodiment.

FIG. 2 is a perspective view illustrating a mold member of the interrupter according to this embodiment.

As shown in FIGS. 1 and 2, the interrupter 1 according to this embodiment is a transmissive interrupter. The interrupter 1 includes a pair of strip-shaped metal frames 11 and 12 provided parallel to each other. A light emitting device 13 is mounted illustratively with solder on the upper end portion of the frame 11 and connected to the frame 11. Furthermore, an electrode pad (not shown) is provided on the surface of the light emitting device 13 not bonded to the frame 11, and a bonding wire 15 is bonded to this electrode pad. The other end of the bonding wire 15 is connected to an external lead terminal (not shown).

On the other hand, a light receiving device 14 is mounted illustratively with solder on the upper end portion of the frame 12 and connected to the frame 12. Furthermore, a signal terminal (not shown) is provided on the surface of the light receiving device 14 not bonded to the frame 12, and a bonding wire 16 is bonded to this signal terminal. The other end of the bonding wire 16 is connected, illustratively, to a diode, IC chip, or lead terminal (not shown).

Thus, the light emitting device 13 and the light receiving device 14 are placed opposite to each other, and the light receiving device 14 is placed at a position on which the light emitted from the light emitting device 13 can be incident. The linear light path from the center of the light emitting device 13 to the center of the light receiving device 14, that is, the optically shortest light path between the light emitting device 13 and the light receiving device 14, is defined as a main light path L1. In FIG. 1, the main light path L1 is shown by one arrow, but actually, it has a width allowing a sufficient amount of light to travel.

The light emitting device 13 is illustratively an LED (light emitting diode), and the light receiving device 14 is illustratively a photo IC (integrated circuit). In this disclosure, the end portion of the frames 11 and 12 on which the light emitting device 13 and the light receiving device 14 are mounted is referred to as "upper end portion", and the end portion on the other side is referred to as "lower end portion". However, this is for convenience, and independent of the direction of gravity. In the following, the extending direction of the frame 11 or 12 is referred to as "vertical direction", the direction connecting between the light emitting device 13 and the light receiving device 14 is referred to as "light path direction", and the direction orthogonal to both the vertical direction and the light path direction is referred to as "horizontal direction".

The interrupter 1 is provided with a mold member 20, which encloses the above devices, frames, and bonding wires and protects them from mechanical stress, oxidation and the like. The mold member 20 is formed from a translucent resin material that transmits part of the light emitted from the light emitting device 13 and absorbs the rest. The mold member 20 is formed by molding the frames 11 and 12 with a translucent resin after mutually positioning the frame 11 with the light emitting device 13 mounted thereon and the frame 12 with the light receiving device 14 mounted thereon.

The mold member 20 has a square U shape. More specifically, the mold member 20 is composed of a bridge section 21 extending in the light path direction and a light emitting section 22 and a light receiving section 23 standing upward from both end portions of the bridge section 21. The light emitting section 22 and the light receiving section 23 are spaced from each other by a gap 24 therebetween. The light emitting section 22 encloses the light emitting device 13, the portion of the frame 11 excluding its lower end portion, and the bonding wire 15. On the other hand, the light receiving section 23 encloses the light receiving device 14, the portion of the frame 12 excluding its lower end portion, and the bonding wire 16. The lower portions of the frames 11 and 12 protrude from the lower surface of the bridge section 21.

A recess 25 is formed in the region of the light emitting section 22 intervening in the main light path L1. The recess 25 is shaped like a cuboid-shaped groove extending in the vertical direction, and its horizontal width is smaller than the width of the light emitting device 13. Furthermore, the recess 25 is opened at the surface of the light emitting section 22 on the gap 24 side and at the upper surface of the light emitting section 22 adjacent to this surface. Thus, the mold member 20 enclosing the light emitting device 13 is relatively thin in the region intervening in the main light path L1, and relatively thick in the region therearound.

Likewise, a recess 26 is formed in the region of the light receiving section 23 intervening in the main light path L1. The recess 26 is shaped like a cuboid-shaped groove extending in the vertical direction, and its horizontal width is smaller than the width of the light receiving device 14. Furthermore, the recess 26 is opened at the surface of the light receiving section 23 on the gap 24 side and at the upper surface of the light receiving section 23 adjacent to this surface. Thus, the mold member 20 enclosing the light receiving device 14 is relatively thin in the region intervening in the main light path L1, and relatively thick in the region therearound.

Next, the operation of the interrupter according to this embodiment is described.

Figure 3:
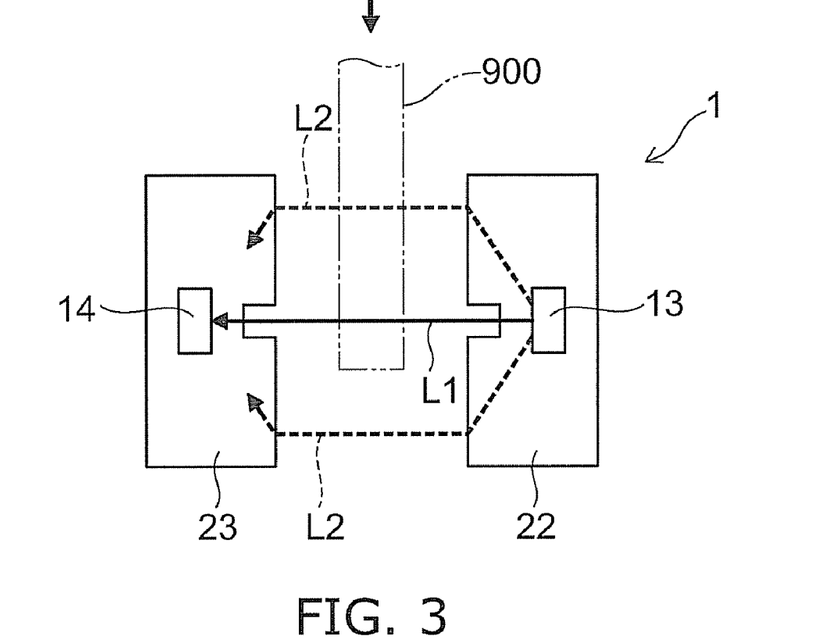
FIG. 3 is an optical model diagram illustrating the operation of the interrupter according to the first embodiment as viewed from above.

FIG. 3 is an optical model diagram illustrating the operation of the interrupter according to this embodiment as viewed from above.

It is noted that in FIG. 3, components other than the light emitting device 13, the light receiving device 14, and the light emitting section 22 and the light receiving section 23 of the mold member are not shown.

As shown in FIGS. 1 and 3, the light emitting device 13 emits light upon supply of electric power thereto through the frame 11 and the bonding wire 15. Here, part of the light emitted from the light emitting device 13 propagates along the main light path L1 and reaches the light receiving device 14. Another part of this light propagates along a light path other than the main light path L1 (hereinafter referred to as "side light path L2") and reaches the light receiving device 14. The side light path L2 is a light path bypassing the main light path L1 illustratively by refraction or scattering at the surface of or inside the light emitting section 22 or the light receiving section 23. Although an infinite number of side light paths L2 can exist, FIG. 3 illustrates part of them by dashed lines. The rest of the light emitted from the light emitting device 13 is absorbed in the mold member 20, or emitted to the outside of the interrupter 1.

The light receiving device 14 converts the incident light to a current and outputs it through the frame 12 and the bonding wire 16. If a target to be detected 900, which is a light blocking object, intervenes in the main light path L1 or the side light path L2 during light emission by the light emitting device 13, then the target to be detected 900 blocks light. Hence, the amount of light received by the light receiving device 14 decreases, and the current outputted from the light receiving device 14 decreases. Thus, the presence of the target to be detected 900 can be sensed by measuring the current outputted from the light receiving device 14.

In this embodiment, because the recess 25 is formed in the light emitting section 22 of the mold member 20, the mold member 20 enclosing the light emitting device 13 is relatively thin in the region intervening in the main light path L1, and relatively thick in the region therearound. Likewise, because the recess 26 is formed in the light receiving section 23, the mold member 20 enclosing the light receiving device 14 is relatively thin in the region intervening in the main light path L1, and relatively thick in the region therearound. Furthermore, in this embodiment, a translucent resin absorbing part of the light and transmitting the rest is used as a packaging material for forming the mold member 20.

Thus, along the main light path L1, the proportion of light absorbed in the mold member 20 is relatively small, and the proportion of light reaching the light receiving device 14 through the mold member 20 is relatively large. On the other hand, in the side light path L2, the proportion of light absorbed in the mold member 20 is relatively large, and the proportion of light reaching the light receiving device 14 through the mold member 20 is relatively small. Thus, most of the unwanted refracted light and scattered light propagating along the side light path L2 is absorbed in the mold member 20. Hence, in the interrupter 1 according to this embodiment, optical coupling between the light emitting device 13 and the light receiving device 14 includes optical coupling through the main light path L1 in a high proportion, and optical coupling through the side light path L2 in a low proportion. Consequently, the interrupter 1 has a high decrease ratio of current upon passage of the target to be detected 900 through the main light path L1, which results in a high detection accuracy.

Furthermore, in this embodiment, the mold member 20 can be formed by one step of molding with a translucent resin. Hence, the interrupter 1 can be manufactured at low cost. Moreover, the minimum size of the mold member 20 depends on the minimum resin thickness for one molding step. Hence, the interrupter can be downsized as compared with the case where the mold member is formed by a plurality of molding steps.

Furthermore, the recesses 25 and 26 are opened at two surfaces, that is, the surface facing the gap 24 and the upper surface of the mold member 20. Hence, this embodiment has good extractability in molding, and the mold is easy to form.

In the following, the effect of this embodiment is described with reference to comparative examples of this embodiment, beginning with the description of a first comparative example.

Figure 4:
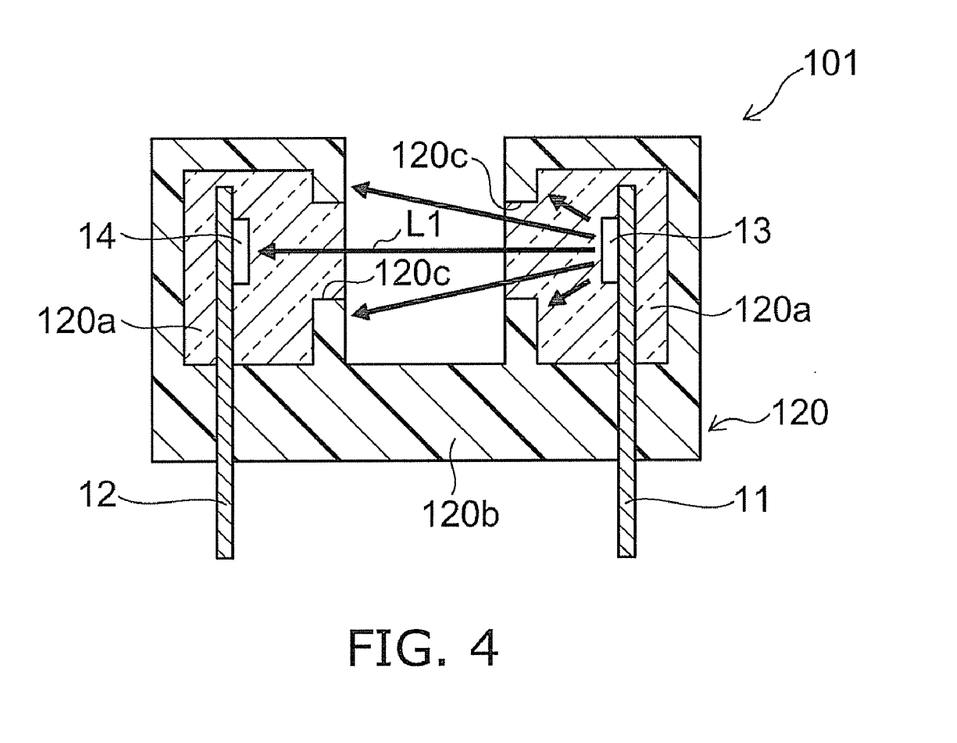
FIG. 4 is a cross-sectional view illustrating an interrupter according to a first comparative example.

FIG. 4 is a cross-sectional view illustrating an interrupter according to the first comparative example.

Figure 5:
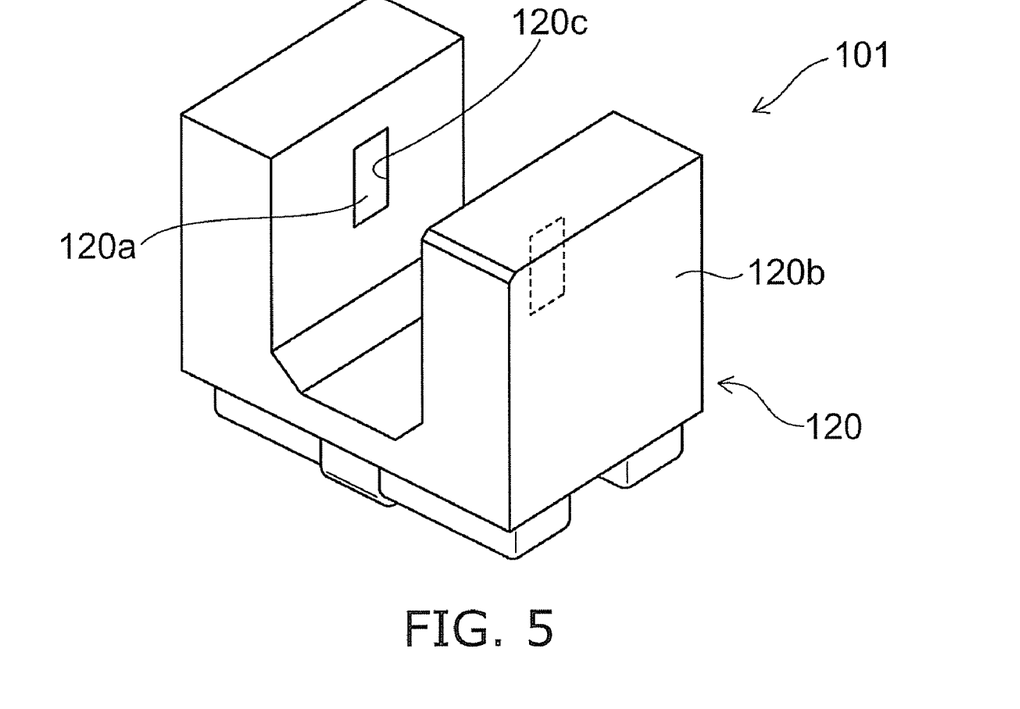
FIG. 5 is a perspective view illustrating the interrupter according to the first comparative example.

FIG. 5 is a perspective view illustrating this interrupter.

In FIG. 4, for convenience of illustration, bonding wires are not shown. The same also applies to the other subsequent figures.

As shown in FIGS. 4 and 5, in the interrupter 101 according to this comparative example, the mold member 120 has a double mold structure composed of two types of resins. More specifically, the core sections 120a enclosing the light emitting device 13 and the light receiving device 14 are formed from a transparent resin that transmits light without substantial absorption. Furthermore, the envelope section 120b enclosing the core section 120a is formed from a light blocking resin, such as a black resin, that does not substantially transmit light. A vertically extending slit 120c is formed in a region of the envelope section 120b intervening in the main light path L1.

In the interrupter 101 according to this comparative example, light is propagated from the light emitting device 13 to the light receiving device 14 only through the slit 120c, and not propagated through the other light paths. Hence, the light path can be restricted almost to the main light path L1, achieving a high detection accuracy for the target to be detected.

However, manufacturing of the interrupter 101 requires two molding steps, that is, molding with a transparent resin and molding with a light blocking resin. Hence, such steps as optimization of the molding condition and the post-molding inspection each require two iterations, increasing the manufacturing cost. Furthermore, the size of the mold member 120 having a double mold structure is constrained by the total dimension of the minimum resin thickness of the molds. Hence, the interrupter 101 is difficult to downsize.

Furthermore, the width of the slit 120c in the mold member 120 having a double mold structure has a limit for mechanical processing accuracy. Currently, the processing accuracy allowing stable on/off characteristics has a limit of approximately 0.2 mm.

The interruption characteristic of the interrupter 101 is nearly proportional to the dimension of the slit 120c. Hence, good interruption characteristic is achieved by decreasing the width and/or height of the slit. However, decreasing the width and/or height of the slit results in decreasing the amount of light incident on the light receiving device and decreasing the optical coupling efficiency. Thus, there is a tradeoff between the dimension of the slit and the optical coupling efficiency.

Next, a second comparative example is described.

Figure 6:
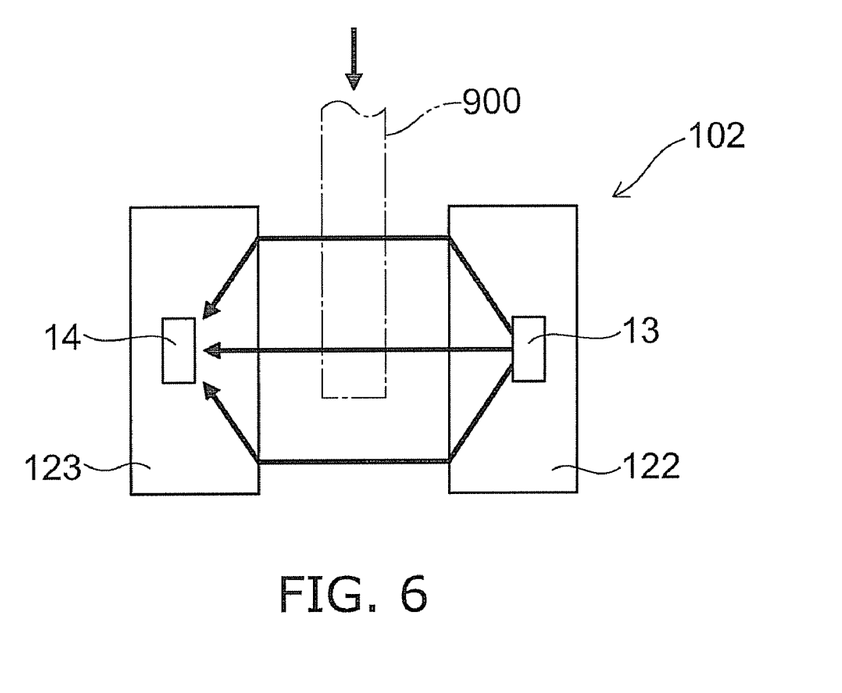
FIG. 6 is an optical model diagram illustrating an interrupter according to a second comparative example as viewed from above.

FIG. 6 is an optical model diagram illustrating an interrupter according to the second comparative example as viewed from above.

As shown in FIG. 6, in the interrupter 102 according to this comparative example, the mold member is entirely formed from a transparent resin. Thus, the interrupter 102 can be manufactured by one molding step, requiring only one iteration for such steps as optimization of the resin molding condition and the post-molding inspection. Hence, the manufacturing cost is low.

However, in the interrupter 102, light emitted from the light emitting device 13 is reflected, refracted, or scattered inside or at the surface of the light emitting section 122 and emitted from the entirety of the light emitting section 122. Then, the light incident on the entirety of the light receiving section 123 may reach the light receiving device 14. That is, in the interrupter 102, light propagates from the entirety of the light emitting section 122 to the entirety of the light receiving section 123. Thus, the interrupter 102 is less sensitive to the target to be detected 900, which results in a low detection accuracy.

In contrast, as described above, the interrupter 1 according to this embodiment (see FIG. 1) includes recesses 25 and 26, which serve to achieve a high detection accuracy. Furthermore, the manufacturing cost is low because the interrupter 1 can be manufactured in one molding step.

In the following, the calculation result and simulation result demonstrating the effect of this embodiment are illustrated.

It is assumed that in the mold member 20 enclosing the light emitting device 13 and the light receiving device 14, the portion other than the recesses 25 and 26 has a thickness of 1 mm, the portion where the recess 25 or 26 is formed has a thickness of half thereof, that is, 0.5 mm, and the translucent resin forming the mold member 20 has an optical absorptance of 50%/mm. The proportion of light absorbed is assumed to be proportional to the thickness of the resin. Then, the optical coupling efficiency P1 of the main light path L1, that is, the ratio of the amount of light incident from the main light path L1 on the light receiving device 14 versus the amount of light emitted from the light emitting device 13 to the main light path L1, is determined by the following formula (1).

$$P1=(1-0.5/2)\times(1-0.5/2)\times100\sim56.3\% \tag{1}$$

On the other hand, the optical coupling efficiency P2 of the side light path L2 is determined by the following formula (2).

$$P2=(1-0.5)\times(1-0.5)\times100=25\% \tag{2}$$

Hence, the optical coupling ratio between the main light path L1 and the side light path L2 is approximately 2:1. Thus, a sufficiently high detection accuracy can be achieved.

Alternatively, it may be assumed that in the above setting, with the thickness of the portion other than the recesses 25 and 26 left unchanged at 1 mm, the portion where the recess 25 or 26 is formed has a thickness of a quarter thereof, that is, 0.25 mm, and the translucent resin has an optical absorptance of 80%/mm (an optical transmittance of 20%/mm). Then, the optical coupling efficiency P1 of the main light path L1 is determined by the following formula (3), and the optical coupling efficiency P2 of the side light path L2 is determined by the following formula (4).

$$P1=(1-0.8/4)\times(1-0.8/4)\times100=64\% \qquad (3)$$

$$P2=(1-0.8)\times(1-0.8)\times100=4\% \qquad (4)$$

Hence, the optical coupling ratio between the main light path L1 and the side light path L2 is 16:1. Thus, a higher detection accuracy can be achieved. Ideally, unwanted light can be reduced to improve the optical coupling ratio by maximizing the optical absorptance of the resin material and the depth of the recess.

Figure 7A:
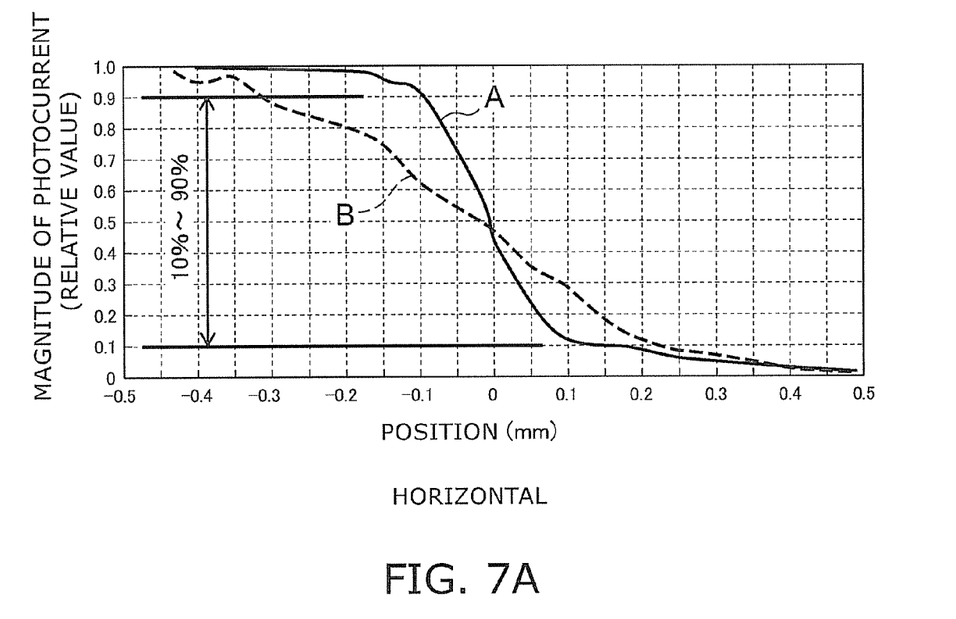
FIG. 7A is a graph illustrating a simulation result for the horizontal interruption characteristic of the interrupter.
Figure 7B:
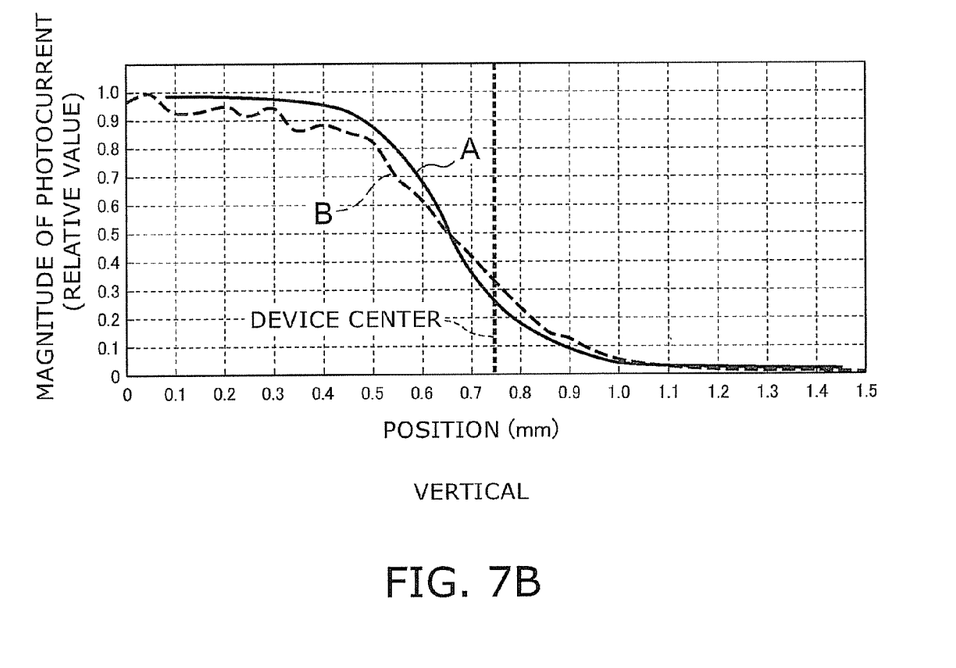
FIG. 7B is a graph illustrating a simulation result for the vertical interruption characteristic of the interrupter.

FIG. 7A is a graph illustrating a simulation result for the horizontal interruption characteristic of the interrupter in which the horizontal axis represents the horizontal position of the target to be detected, and the vertical axis represents the magnitude of photocurrent. FIG. 7B is a graph illustrating a simulation result for the vertical interruption characteristic of the interrupter in which the horizontal axis represents the vertical position of the target to be detected, and the vertical axis represents the magnitude of photocurrent.

In FIGS. 7A and 7B, the solid line A represents the characteristic of the interrupter according to the first embodiment, and the dashed line B represents the characteristic of the interrupter according to the second comparative example. In the interrupter according to the first embodiment represented by the solid line A, it was assumed that the thickness of the portion of the mold member other than the recess is 1 mm, the thickness of the portion of the mold member where the recess is formed is a quarter thereof, that is, 0.25 mm, the optical absorptance is 80%/mm, and the horizontal width of the recess is 0.2 mm. On the horizontal axis of FIG. 7A, the point of 0 mm corresponds to the situation where the edge of the target to be detected is placed at the horizontal center of the recess, and the positive direction is defined as the direction of motion of the target to be detected that causes the light path to be blocked more largely. Furthermore, on the horizontal axis of FIG. 7B, the positive direction represents the downward direction. It was further assumed that the light emitting device always emits light at a constant output. The photocurrent refers to the output current of the light receiving device, and is proportional to the optical coupling efficiency if the amount of light emitted is constant. Hence, the vertical axis of FIGS. 7A and 7B represents the optical coupling efficiency of each interrupter.

As shown in FIGS. 7A and 7B, when the target to be detected 900 is not present in the gap 24, the optical coupling efficiency between the light emitting device 13 and the light receiving device 14 is maximized. Hence, the magnitude of photocurrent is maximized, and the interrupter is in the on-state. As the target to be detected 900 is gradually moved into the gap 24, the light is blocked accordingly. Hence, the photocurrent continuously decreases, and the interrupter is gradually turned into the off-state. When the target to be detected 900 completely blocks the light path (the main light path L1 and the side light path L2), the optical coupling efficiency vanishes.

The variation of photocurrent is steeper in the interrupter 1 according to this embodiment, that is, the interrupter with the mold member 20 made of a translucent resin and the recesses 25 and 26 formed therein, than in the interrupter 102 according to the second comparative example, that is, the interrupter with the mold member entirely made of a transparent resin. Specifically, the interruption characteristic of an interrupter is defined herein as the distance between the position of the target to be detected where the magnitude of photocurrent is 0.1 (10%) in relative value and the position of the target to be detected where it is 0.9 (90%). Then, the horizontal interruption characteristic of the interrupter 1 according to the first embodiment represented by the solid line A was approximately ±0.10 mm, and the horizontal interruption characteristic of the interrupter 102 according to the second comparative example represented by the dashed line B was approximately ±0.26 mm.

It is noted that the variation in FIGS. 7A and 7B is gradual in the photocurrent range of 0.1 or less. This is because, even after the target to be detected 900 blocks the main light path L1 and its neighboring light paths, coupling remains for light propagating along part of the side light path L2, and for light emitted from the recess 25 of the light emitting section 22, being incident on the portion of the light receiving section 23 other than the recess 26, and reaching the light receiving device 14.

Figure 8A:
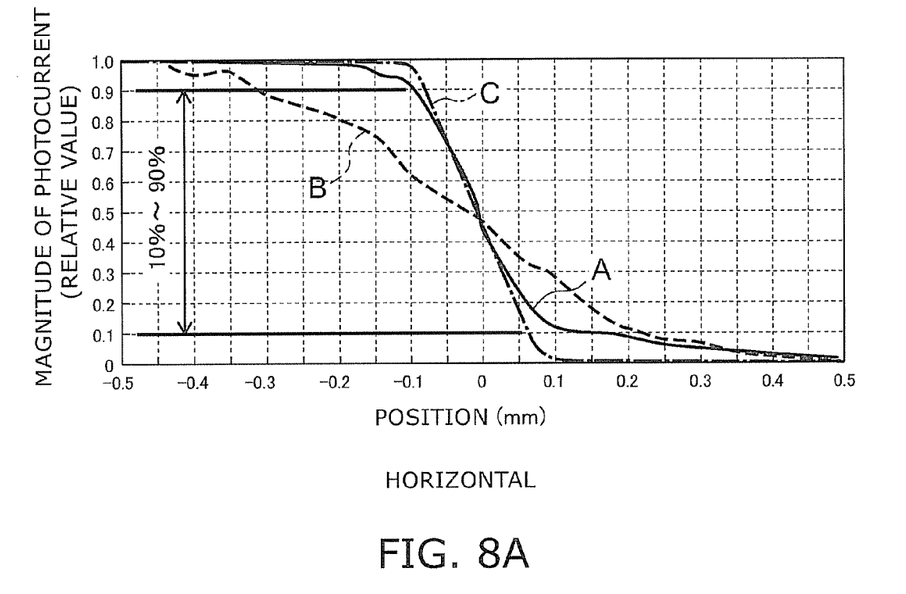
FIG. 8A is a graph illustrating a simulation result for the horizontal interruption characteristic of the interrupter.
Figure 8B:
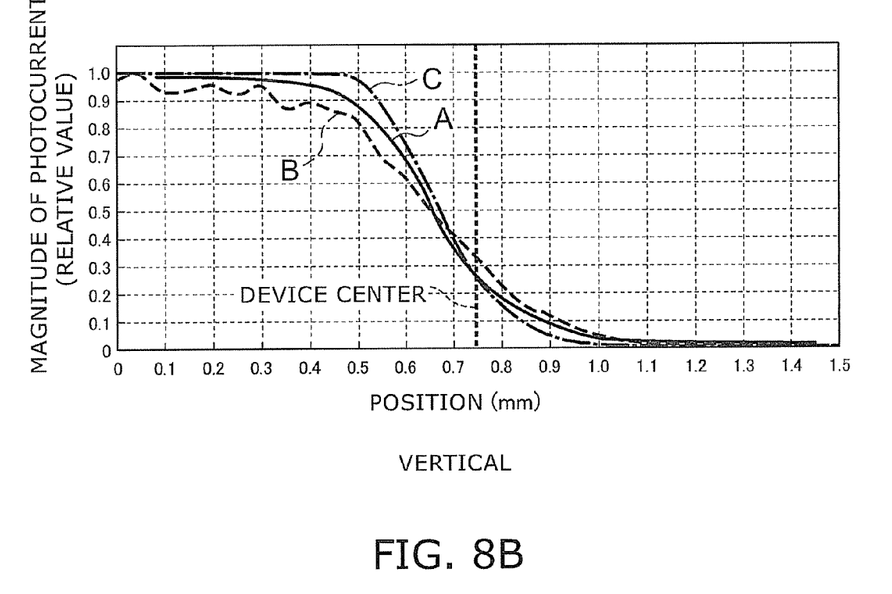
FIG. 8B is a graph illustrating a simulation result for the vertical interruption characteristic of the interrupter.

FIG. 8A is a graph illustrating a simulation result for the horizontal interruption characteristic of the interrupter in which the horizontal axis represents the horizontal position of the target to be detected, and the vertical axis represents the magnitude of photocurrent. FIG. 8B is a graph illustrating a simulation result for the vertical interruption characteristic of the interrupter in which the horizontal axis represents the vertical position of the target to be detected, and the vertical axis represents the magnitude of photocurrent.

In FIGS. 8A and 8B, the dot-dashed line C represents the characteristic of the interrupter according to the first comparative example, and the dashed line B represents the characteristic of the interrupter according to the second comparative example. In the interrupter 101 according to the first comparative example, it was assumed that the horizontal width of the slit 120c is 0.25 mm. The simulation condition and the notation other than the foregoing are the same as those in FIGS. 7A and 7B. For comparison purposes, FIG. 8 also shows the solid line A (see FIG. 7) representing the interruption characteristic of the first embodiment.

As shown in FIGS. 8A and 8B, the interrupter 101 according to the first comparative example had a more favorable interruption characteristic than the interrupter 102 according to the second comparative example. More specifically, as represented by the dot-dashed line C, the horizontal interruption characteristic of the interrupter 101 according to the first comparative example was approximately ±0.07 mm, and its vertical interruption characteristic was approximately ±0.5 mm. The interruption characteristic of the interrupter 1 according to the first embodiment (solid line A) was nearly comparable to the interruption characteristic of the interrupter 101 according to the first comparative example (dot-dashed line C).

Thus, this embodiment can realize an interrupter which can be manufactured at lower cost in a smaller size than the first comparative example formed in two molding steps, and which has a more favorable interruption characteristic than the second comparative example made of a transparent resin.

This embodiment has described an example in which the mold member 20 includes a recess 25 in the light emitting section 22 and a recess 26 in the light receiving section 23. However, the invention is not limited thereto, but a certain effect can be achieved also in the case where only one of the recesses 25 and 26 is formed. The same also applies to the other embodiments described below. Furthermore, this embodiment has described an example in which the recesses 25 and 26 are shaped like a cuboid-shaped groove. However, the invention is not limited thereto, but only requires a relative difference in the thickness of the translucent resin between the region intervening in the main light path L1 and its surrounding region. For example, as viewed along the light path, the recess can be shaped like a circle, ellipse, or rectangle. Furthermore, this embodiment has described an example in which a recess is formed in the region of the mold member intervening in the main light path L1. However, conversely, the region surrounding the region intervening in the main light path L1 can be raised.

Next, a second embodiment of the invention is described.

The interrupter according to this embodiment is different from the interrupter 1 according to the above first embodiment (see FIG. 1) in that a filler is added to the resin material forming the mold member. That is, the mold member is formed from a translucent resin material and a filler. Thus, for example, in the case where a filler for improving heat resistance is added to the resin material, the mold member has an improved heat resistance and can resist even a severe reflow condition. Furthermore, in the case of adding a filler that has optical characteristics such as optical refractive index or absorptance and transmittance being different from those of the resin material serving as a matrix, various optical designs are allowed in the mold member. The configuration, operation, and effect in this embodiment other than the foregoing are the same as those in the above first embodiment.

Next, a third embodiment of the invention is described.

Figure 9:
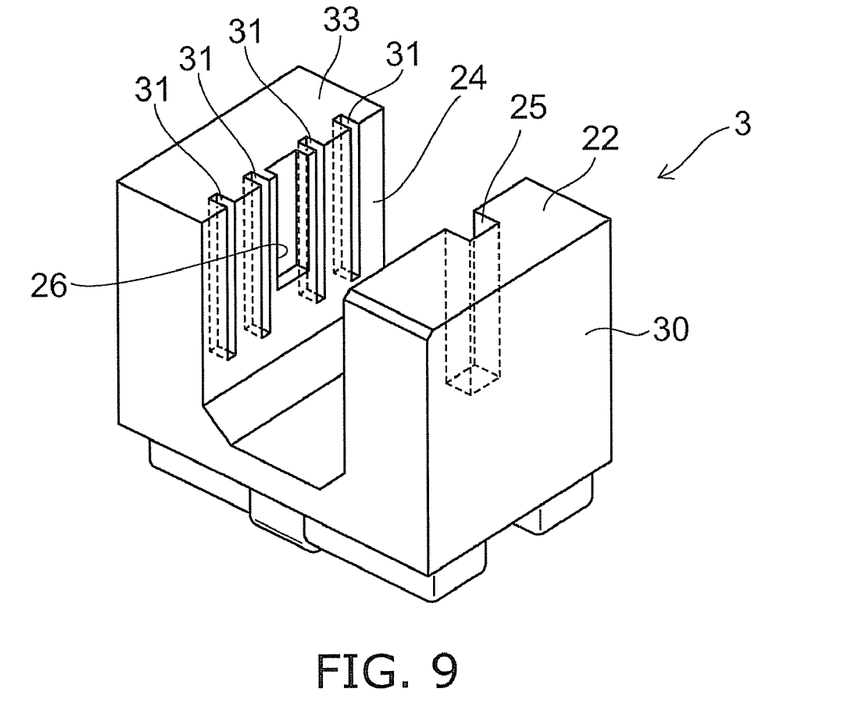
FIG. 9 is a perspective view illustrating an interrupter according to a third embodiment of the invention.

FIG. 9 is a perspective view illustrating an interrupter according to this embodiment.

As shown in FIG. 9, in the interrupter 3 according to this embodiment, a plurality of grooves 31 are formed on both horizontal sides of the light receiving device 14 in the light receiving section 33 of the mold member 30. The groove 31 is formed in a region surrounding the region intervening in the main light path L1 at the surface of the light receiving section 33 facing the gap 24, and is trenched from the surface exposed to the gap 24 and from above. That is, the groove 31 is opened to two directions on the light emitting device 13 side and the upper side. The configuration in this embodiment other than the foregoing is the same as that in the above first embodiment.

Next, the operation and effect of this embodiment are described.

Figure 10:
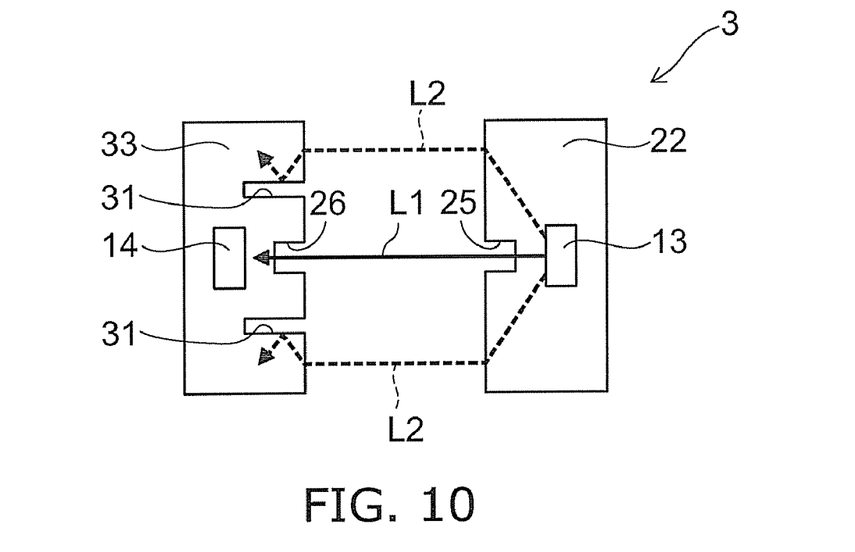
FIG. 10 is an optical model diagram illustrating the operation of the interrupter according to the third embodiment as viewed from above.

FIG. 10 is an optical model diagram illustrating the operation of the interrupter according to this embodiment as viewed from above. For simplicity of illustration, FIG. 10 shows only one pair of grooves 31.

As shown in FIG. 10, in the interrupter 3 according to this embodiment, light incident on the light receiving section 33 horizontally from the outside through the side light path L2 is reflected at the side surface of the groove 31 horizontally to the outside, and does not reach the light receiving device 14. On the other hand, light propagating along the main light path L1 is not affected by the grooves 31. Thus, in the optical coupling between the light emitting device 13 and the light receiving device 14, the proportion of optical coupling through the main light path L1 can be further increased, and the detection accuracy for the target to be detected 900 is further improved.

Furthermore, the groove 31 is opened to the two directions on the light emitting device 13 side and the upper side. Hence, this embodiment has good extractability in molding, and the mold is easy to form.

Next, calculation results demonstrating the effect of this embodiment are illustrated.

It is assumed that in the mold member 30, the portion other than the recesses 25 and 26 has a thickness of 1 mm, the portion where the recess 25 or 26 is formed has a thickness of half thereof, and the translucent resin forming the mold member 30 has an optical absorptance of 50%/mm. The proportion of light absorbed is assumed to be proportional to the thickness of the resin. Furthermore, the depth of the groove 31 in the light path direction and the vertical direction is assumed to be sufficiently large. Then, the optical coupling efficiency P1 of the main light path L1 is 56.3% according to the above formula (1). On the other hand, it is considered that light traveling along the side light path L2 is all reflected by the grooves 31 and does not reach the light receiving device 14. Hence, the optical coupling efficiency P2 for light traveling along the side light path L2 is 0%. Thus, the optical coupling ratio between the main light path L1 and the side light path L2 is 1:0. Alternatively, in the case where the thickness of the mold member at the recesses 25 and 26 is a quarter of the thickness of the other portion and the resin material has an optical absorptance of 80%/mm, the optical coupling efficiency P1 of the main light path L1 is 64% according to the above formula (3). Also in this case, the optical coupling efficiency P2 of the side light path L2 is 0%. Hence, the optical coupling ratio is 1:0.

A simulation was made in the case where the recesses 25 and 26 each have a horizontal width of 0.2 mm, the thickness of the mold member at the recesses 25 and 26 is a quarter of the thickness of the other portion, and the resin material has an optical absorptance of 80%/mm. The simulation result is shown in FIG. 11.

Figure 11:
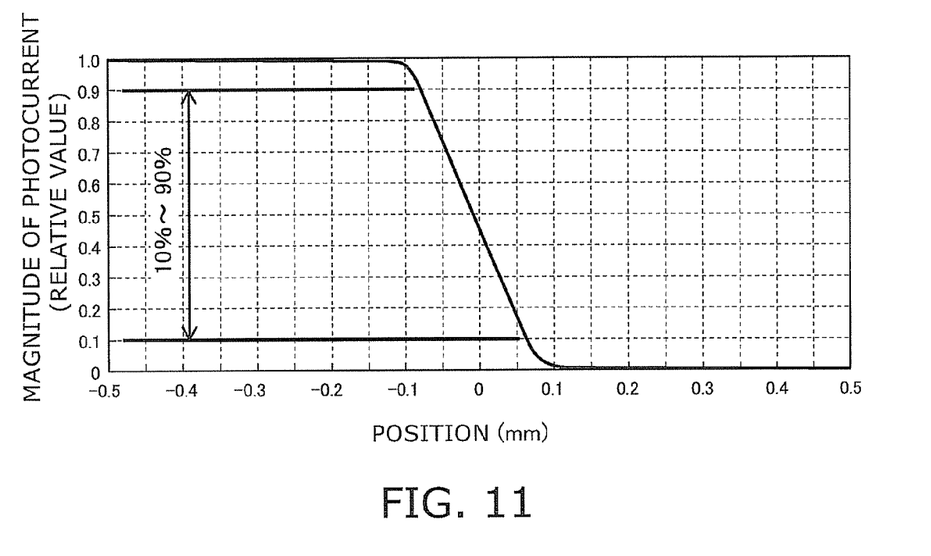
FIG. 11 is a graph illustrating a simulation result for the horizontal interruption characteristic of the interrupter.

FIG. 11 is a graph illustrating a simulation result for the horizontal interruption characteristic of the interrupter in which the horizontal axis represents the horizontal position of the target to be detected, and the vertical axis represents the magnitude of photocurrent.

As shown in FIG. 11, the horizontal interruption characteristic of the interrupter 3 was approximately ±0.07 mm. Hence, according to this embodiment, the interrupter having on/off characteristics comparable to that of the above first comparative example (see the dot-dashed line C in FIG. 8A) can be manufactured in one molding step.

Furthermore, this embodiment can be combined with the above second embodiment. That is, a filler can be added to the resin material constituting the mold member 30. In this case, light scattered by the filler can be reflected at the side surface of the grooves 31 to prevent the light from reaching the light receiving device 14. Consequently, by allowing the mold member 30 to contain a filler, an interrupter having good on/off characteristics can be realized even in the case where light scattered at the surface of or inside the mold member 30 is increased. Thus, for example, an interrupter superior in both heat resistance and on/off characteristics can be realized.

Next, a fourth embodiment of the invention is described.

Figure 12:
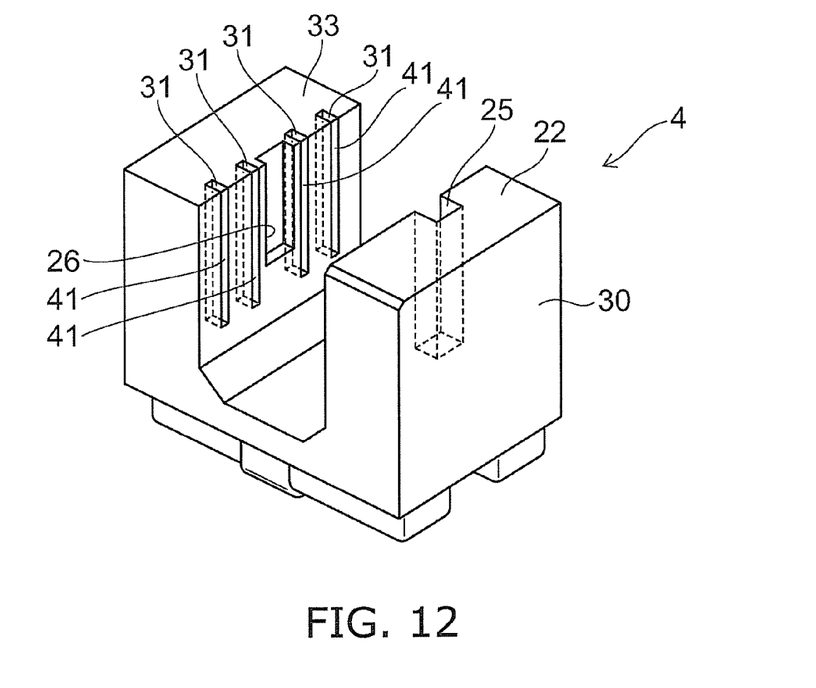
FIG. 12 is a perspective view illustrating an interrupter according to a fourth embodiment of the invention.

FIG. 12 is a perspective view illustrating an interrupter according to this embodiment.

As shown in FIG. 12, the interrupter 4 according to this embodiment is different from the interrupter 3 according to the above third embodiment (see FIG. 9) in that an opaque resin 41 is buried in the grooves 31. Thus, the side light path L2 can be blocked more reliably. Furthermore, the surface of the mold member can be flattened, which serves to prevent attachment of dust and dirt. The configuration, operation, and effect in this embodiment other than the foregoing are the same as those in the above third embodiment.

Next, a fifth embodiment of the invention is described.

Figure 13:
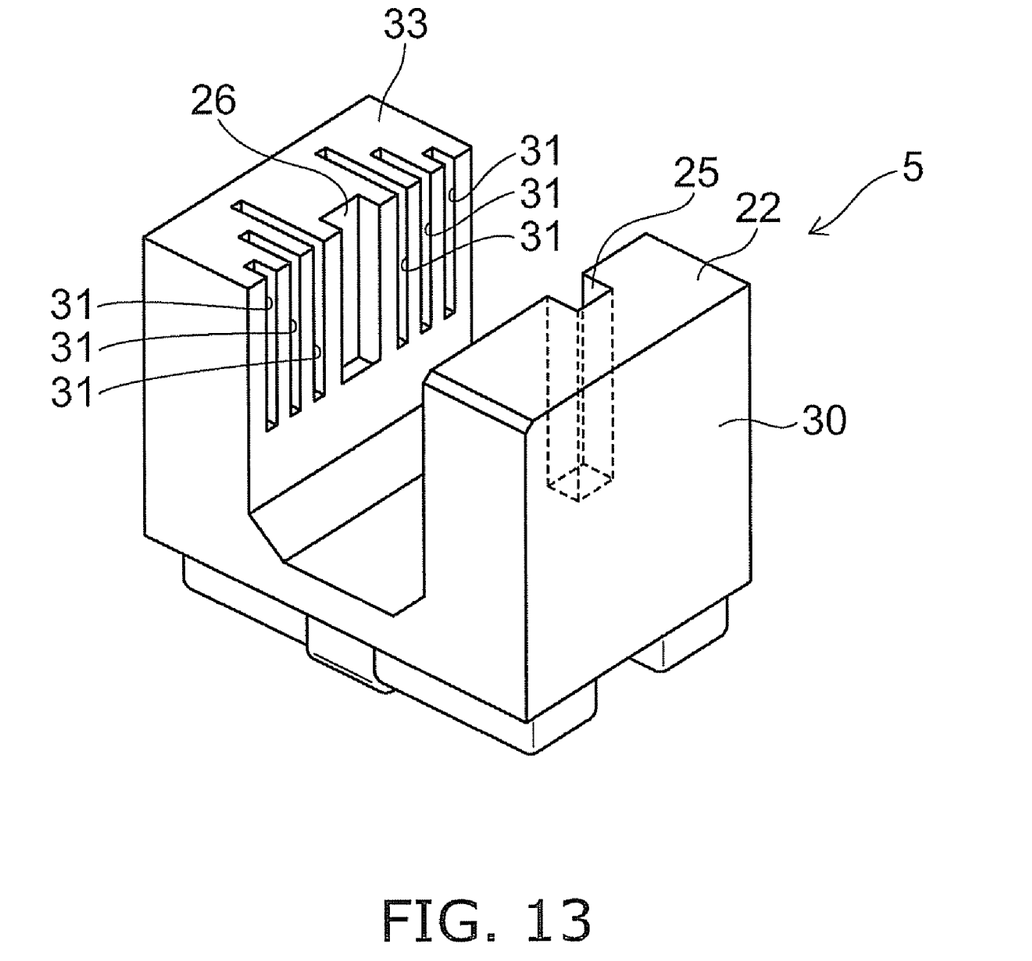
FIG. 13 is a perspective view illustrating an interrupter according to a fifth embodiment of the invention.

FIG. 13 is a perspective view illustrating an interrupter according to this embodiment.

As shown in FIG. 13, the interrupter 5 according to this embodiment is different from the interrupter 3 according to the above third embodiment (see FIG. 9) in that, of the plurality of grooves 31, the groove 31 located closer to the horizontal center portion of the light receiving section 33, that is, the portion where the light receiving device 14 (see FIG. 1) and the recess 26 are formed, is deeper along the optical axis. The vertical depth and the horizontal width are illustratively uniform among the grooves 31.

According to this embodiment, the groove 31 closer to the light receiving device 14 is formed relatively deep so that light reaching the light receiving device 14 through the side light path can be reduced more reliably. On the other hand, the groove 31 in the peripheral portion is formed relatively shallow so that the mechanical strength of the mold member can be ensured. The configuration, operation, and effect in this embodiment other than the foregoing are the same as those in the above third embodiment. Also in this embodiment, like the above fourth embodiment, an opaque resin can be buried in the groove 31.

Next, a sixth embodiment of the invention is described.

Figure 14A:
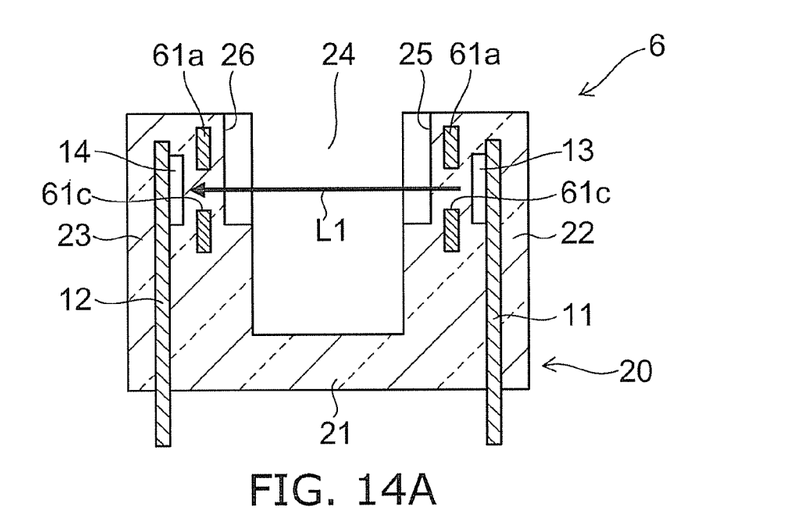
FIG. 14A is a cross-sectional view illustrating an interrupter according to a sixth embodiment of the invention.
Figure 14B:
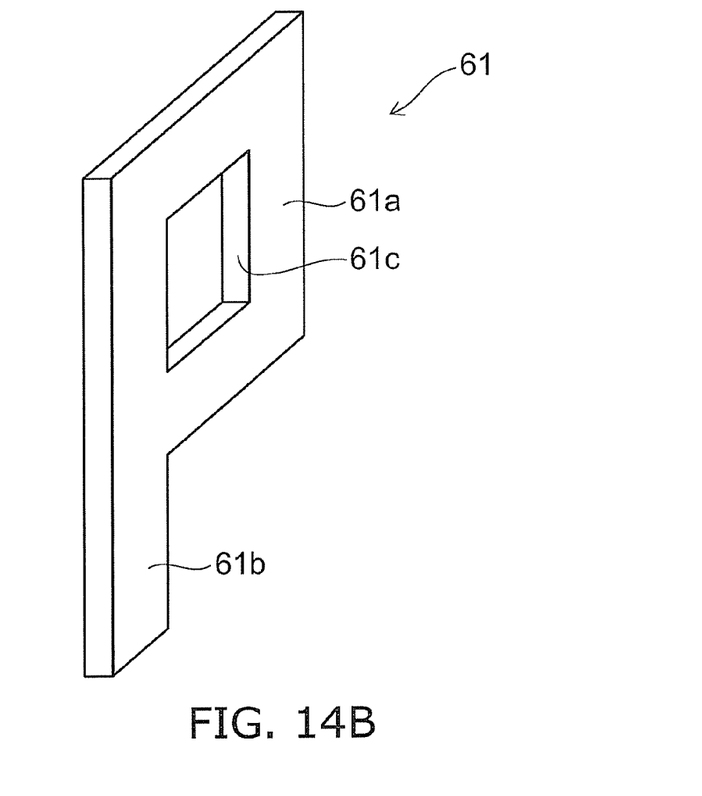
FIG. 14B is a perspective view illustrating a light shaping member of this interrupter.

FIG. 14A is a cross-sectional view illustrating an interrupter according to this embodiment, and FIG. 14B is a perspective view illustrating a light shaping member of this interrupter.

As shown in FIGS. 14A and 14B, the interrupter 6 according to this embodiment includes a pair of light shaping members 61 in addition to the configuration of the interrupter 1 according to the above first embodiment. The light shaping member 61 is formed from an opaque material. Each light shaping member 61 has a P shape, which includes a frame section 61a illustratively shaped like a rectangular frame and a bar-shaped support section 61b extending downward from a corner of the frame section 61a. The frame section 61a has an opening 61c illustratively shaped like a rectangle.

One of the light shaping members 61 is embedded in the light emitting section 22 of the mold member 20 and located at a position on the light receiving device 14 side of the light emitting device 13 so that the main light path L1 passes through the opening 61c of this light shaping member 61. The other light shaping member 61 is embedded in the light receiving section 23 of the mold member 20 and located at a position on the light emitting device 13 side of the light receiving device 14 so that the main light path L1 passes through the opening 61c of this light shaping member 61. Thus, the light shaping members 61 are provided so that they do not intervene in the main light path L1, but intervene in at least part of the side light paths L2. The support section 61b of the light shaping member 61 serves to position the light shaping member 61 during molding.

Next, the operation and effect of this embodiment are described.

Of the light emitted from the light emitting device 13, the light propagating along the main light path L1 passes through the opening 61c of the light shaping member 61 embedded in the light emitting section 22, is emitted from the recess 25 to the outside of the light emitting section 22, passes through the gap 24, is incident from the recess 26 into the light receiving section 23, passes through the opening 61c of the light shaping member 61 embedded in the light receiving section 23, and incident on the light receiving device 14. On the other hand, most of the light emitted from the light emitting device 13 in the directions other than the main light path L1 is blocked by the frame section 61a of the light shaping member 61. Thus, according to this embodiment, the frame section 61a of the light shaping member 61 blocks unwanted light so that the detection accuracy for the target to be detected can be further improved. The configuration, operation, and effect in this embodiment other than the foregoing are the same as those in the above first embodiment.

Next, a seventh embodiment of the invention is described.

Figure 15:
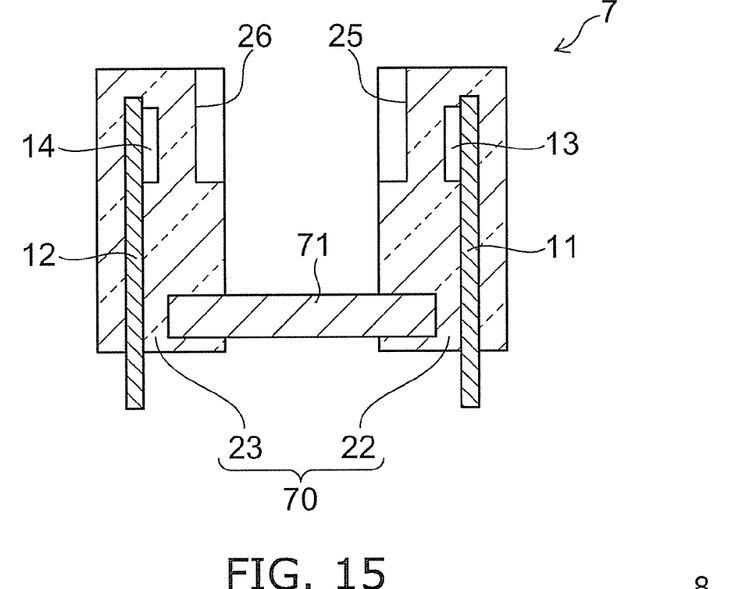
FIG. 15 is a cross-sectional view illustrating an interrupter according to a seventh embodiment of the invention.

FIG. 15 is a cross-sectional view illustrating an interrupter according to this embodiment.

As shown in FIG. 15, in the interrupter 7 according to this embodiment, the mold member 70 does not include a bridge section, but instead includes a bar-shaped support member 71 extending in the light path direction. The support member 71 is formed from an opaque material, such as a metal. To one end of the support member 71 is connected the light emitting section 22 of the mold member 70 enclosing the light emitting device 13. To the other end of the support member 71 is connected the light receiving section 23 of the mold member 70 enclosing the light receiving device 14. That is, the mold member 70 is split into the light emitting section 22 and the light receiving section 23. The light emitting section 22 and the light receiving section 23 are spaced from each other without contact.

In the interrupter 1 according to the above first embodiment (see FIG. 1), a slight portion of the light emitted from the light emitting device 13 propagates in the bridge section 21 of the mold member 20 and reaches the light receiving device 14. Typically, such leakage light through the bridge section 21 is negligible. However, this leakage light may become considerable for an extremely small interrupter and in the case where the mold member 20 is formed from a resin having a relatively low optical absorptance.

In contrast, in this embodiment, the mold member is split into the light emitting section 22 and the light receiving section 23, and these sections are supported by the support member 71 made of an opaque material. Hence, such leakage light does not exist. Furthermore, the support member 71 made of a metal allows an interrupter having high rigidity and reliability to be manufactured in one molding step. The configuration, operation, and effect in this embodiment other than the foregoing are the same as those in the above first embodiment.

Next, an eighth embodiment of the invention is described.

Figure 16:
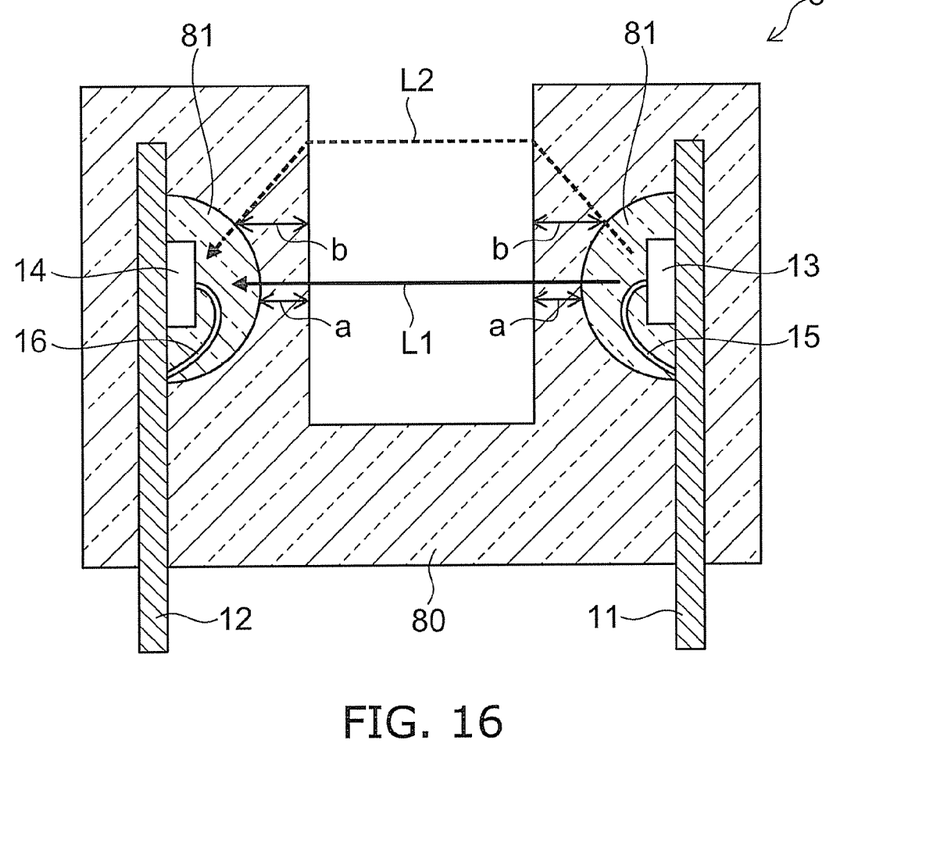
FIG. 16 is a cross-sectional view illustrating an interrupter according to an eighth embodiment of the invention.

FIG. 16 is a cross-sectional view illustrating an interrupter according to this embodiment.

As shown in FIG. 16, in the interrupter 8 according to this embodiment, a transparent section 81 made of a transparent material, which does not substantially absorb light, is provided inside the mold member 80. The transparent section 81 is illustratively made of a silicone resin and illustratively shaped like a hemisphere. The transparent section 81 is provided on the opposed surfaces of the frames 11 and 12 so as to enclose each of the light emitting device 13 and the light receiving device 14. The transparent section 81 can be formed, illustratively, by dropping a liquid silicone resin on the frame 11 with the light emitting device 13 mounted thereon, and then semi-curing the resin.

Thus, in the interrupter 8, the thickness of the mold member 80 enclosing the light emitting device 13 and the thickness of the mold member 80 enclosing the light receiving device 14 are relatively thin in the region intervening in the main light path L1, and relatively thick in the region therearound. That is, in the example shown in FIG. 16, the thickness a is thinner than the thickness b. Furthermore, the recesses 25 and 26 (see FIG. 1) are not formed in the mold member 80.

According to this embodiment, along the main light path L1, the length passing through the mold member 80 made of an opaque resin (thickness a) is relatively short, whereas along the side light path L2, the length passing through the mold member 80 (thickness b) is relatively long. Hence, the optical coupling efficiency along the main light path L1 is higher than the optical coupling efficiency along the side light path L2. This results in a high detection accuracy for the target to be detected. Furthermore, the light emitting device 13 and the light receiving device 14 as well as the bonding wires 15 and 16 are enclosed with a soft silicone resin so that these devices and wires can be protected from mechanical stress. Moreover, because the recesses 25 and 26 (see FIG. 1) are not formed in the mold member 80, there are no cases where dust and the like enter such recesses. The configuration, operation, and effect in this embodiment other than the foregoing are the same as those in the above first embodiment. It is noted that the transparent section 81 can be provided in only one of the portion enclosing the light emitting device 13 and the portion enclosing the light receiving device 14.

Next, a ninth embodiment of the invention is described.

Figure 17:
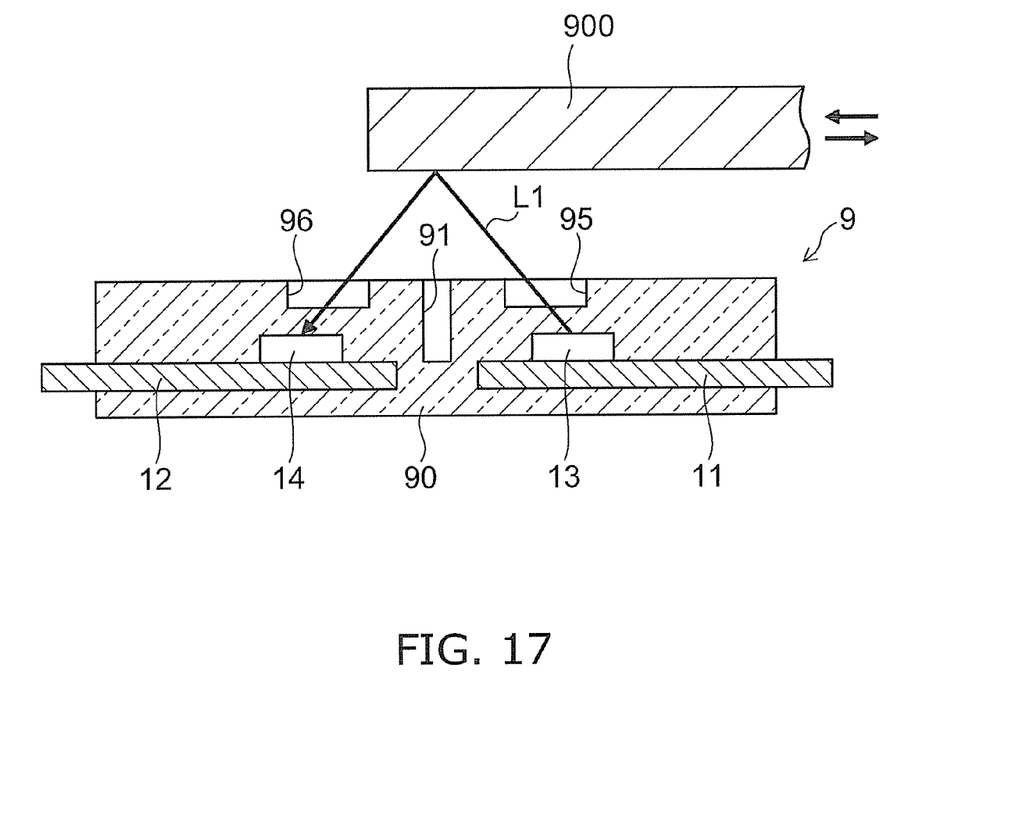
FIG. 17 is a cross-sectional view illustrating an interrupter according to a ninth embodiment of the invention.

FIG. 17 is a cross-sectional view illustrating an interrupter according to this embodiment.

As shown in FIG. 17, the interrupter 9 according to this embodiment is a reflective interrupter. In the interrupter 9, the frame 11 and the frame 12 are placed in a coplanar arrangement. A light emitting device 13 is mounted illustratively with solder on the upper surface of the frame 11 at its end on the frame 12 side. On the other hand, a light receiving device 14 is mounted illustratively with solder on the upper surface of the frame 12 at its end on the frame 11 side. That is, the light emitting device 13 and the light receiving device 14 are placed on the surfaces of the same side (upper surfaces) of the frames 11 and 12 placed in a coplanar arrangement, and the light receiving device 14 is not located at a position on which the light emitted from the light emitting device 13 is directly incident. The light receiving device 14 is located at a position where the light emitted from the light emitting device 13 can be incident by being reflected by the target to be detected 900.

Furthermore, bonding wires (not shown) are bonded to the upper surface of the light emitting device 13 and the upper surface of the light receiving device 14.

Moreover, a mold member 90 made of a translucent resin that transmits part of the light emitted from the light emitting device 13 and absorbs the rest is formed so as to enclose the portion of the frames 11 and 12 excluding the other end thereof, the light emitting device 13 and the light receiving device 14, and the bonding wires. However, in contrast to the above first to eighth embodiment, the mold member 90 does not have a square U shape, but has a shape extending in the direction from the light emitting device 13 to the light receiving device 14, such as a bar shape.

A recess 95 is formed in a directly overlying region of the light emitting device 13, or a region slightly closer to the light receiving device 14, in the upper surface of the mold member 90. On the other hand, a recess 96 is formed in a directly overlying region of the light receiving device 14, or a region slightly closer to the light emitting device 13, in the upper surface of the mold member 90. Furthermore, a groove 91 is formed in the mold member 90 between the light emitting device 13 and the light receiving device 14.

Next, the operation of the interrupter according to this embodiment is described.

As shown in FIG. 17, part of the light emitted from the light emitting device 13 is emitted from the mold member 90 through the recess 95. Here, unless the target to be detected 900 is located at a prescribed detection position above the interrupter 9, this light continues to go straight, and is not incident back on the mold member 90. Hence, the light receiving device 14 outputs no photocurrent. On the other hand, if the target to be detected 900 is located at the detection position, the light emitted from the mold member 90 is reflected by the target to be detected 900, is incident back on the mold member 90 through the recess 96, and reaches the light receiving device 14. Hence, the light receiving device 14 outputs a photocurrent. Thus, the presence of the target to be detected 900 can be sensed.

In this embodiment, of the light paths from the light emitting device 13 to the light receiving device 14, the optically shortest light path is defined as the main light path L1. Like the above embodiments, also in this embodiment, if there is a large amount of light propagating along the side light paths (not shown) other than the main light path L1, the detection accuracy of the interrupter decreases.

Thus, in this embodiment, the recess 95 is formed in the upper surface of the mold member 90 so that the thickness of the mold member 90 enclosing the light emitting device 13 is relatively thin in the region intervening in the main light path L1, and relatively thick in the region therearound. Likewise, the recess 96 is formed so that the thickness of the mold member 90 enclosing the light receiving device 14 is relatively thin in the region intervening in the main light path L1, and relatively thick in the region therearound. Thus, in the optical coupling between the light emitting device 13 and the light receiving device 14, the proportion of optical coupling through the main light path L1 is relatively high, and the proportion of optical coupling through the side light path is relatively low. Consequently, the interrupter 9 has a high detection accuracy for the target to be detected 900.

Furthermore, in this embodiment, the mold member 90 can be formed from a translucent resin in one molding step. Hence, the manufacturing cost of the interrupter 9 can be reduced, and the interrupter 9 can be downsized. Moreover, in this embodiment, because the groove 91 is formed in the mold member 90, propagation of light in the mold member 90 can be effectively prevented. The configuration, operation, and effect in this embodiment other than the foregoing are the same as those in the above first embodiment.

This embodiment has described an example in which the recesses 95 and 96 are formed in the upper surface of the mold member 90. However, the invention is not limited thereto, but a certain effect can be achieved also in the case where only one of the recesses 95 and 96 is formed. Furthermore, the reflective interrupter like this embodiment can also be modified in accordance with the foregoing embodiments. More specifically, like the above second embodiment, a filler can be added to the resin material forming the mold member to improve heat resistance. Like the above third embodiment, a groove can be formed around the region of the mold member intervening in the main light path L1. Like the above fourth embodiment, an opaque resin can be buried in this groove. Like the above fifth embodiment, the groove located closer to the recess can be deepened. Like the above sixth embodiment, a light shaping member can be provided to intervene in at least part of the side light paths. Like the above seventh embodiment, the mold member can be split into the light emitting section and the light receiving section, and a support member illustratively made of a metal can be provided to support these sections spaced from each other. Like the above eighth embodiment, a transparent section shaped like a hemisphere can be provided to enclose at least one of the light emitting device and the light receiving device.

The invention has been described with reference to the embodiments. However, the invention is not limited to these embodiments. For example, those skilled in the art can suitably modify the above embodiments by addition, deletion, or design change of the components thereof, and such modifications are also encompassed within the scope of the invention as long as they fall within the spirit of the invention. Furthermore, the above embodiments can be practiced in combination with each other.

The invention claimed is:

1. An interrupter comprising:
a light emitting device;
a light receiving device placed at a position on which light emitted from the light emitting device can be incident; and
a mold member made of a material that transmits part of the light and absorbs the rest, including a section enclosing the light emitting device and a section enclosing the light receiving device, and having a gap between the light emitting device and the light receiving device,
at least one of the thickness of the section of the mold member enclosing the light emitting device and the thickness of the section of the mold member enclosing the light receiving device being relatively thin in a region intervening in a linear light path from the light emitting device to the light receiving device, and being relatively thick in a surrounding region around said region.

2. The interrupter according to claim 1, wherein a recess is formed in the region of the mold member intervening in the light path.

3. The interrupter according to claim 2, wherein the recess is opened at a surface of the mold member on the gap side and a surface adjacent to said surface.

4. The interrupter according to claim 1, wherein the mold member is formed from a resin material, and a filler is added to the resin material.

5. The interrupter according to claim 1, wherein a groove is formed in the surrounding region of the section of the mold member enclosing the light receiving device.

6. The interrupter according to claim 5, further comprising:
an opaque resin buried in the groove.

7. The interrupter according to claim 5, wherein a plurality of the grooves are formed, and the groove located closer to the light receiving device has a larger depth.

8. The interrupter according to claim 1, further comprising:
a light shaping member made of an opaque material, not intervening in the linear light path, and intervening in at least part of a light path other than the linear light path.

9. The interrupter according to claim 1, further comprising:
a transparent section shaped like a hemisphere and enclosing the light emitting device or the light receiving device.

10. The interrupter according to claim 1, further comprising:
a support member made of an opaque material,
wherein the section of the mold member enclosing the light emitting device is spaced from the section of the mold member enclosing the light receiving device, and the section enclosing the light emitting device is connected to one end of the support member, and the section enclosing the light receiving device is connected to the other end of the support member.

11. The interrupter according to claim 10, wherein the opaque material is a metal.

12. An interrupter comprising:
a light emitting device;
a light receiving device placed at a position on which light emitted from the light emitting device can be incident by being reflected by a target to be detected; and
a mold member made of a material that transmits part of the light and absorbs the rest and including a section enclosing the light emitting device and a section enclosing the light receiving device,
at least one of the thickness of the section of the mold member enclosing the light emitting device and the thickness of the section of the mold member enclosing the light receiving device being relatively thin in a region intervening in the optically shortest light path of light paths starting from the light emitting device, reflected by the target to be detected, and directed to the light receiving device, and being relatively thick in a surrounding region around said region.

13. The interrupter according to claim 12, wherein a recess is formed in the region of the mold member intervening in the light path.

14. The interrupter according to claim 12, wherein the mold member is formed from a resin material, and a filler is added to the resin material.

15. The interrupter according to claim 12, wherein a groove is formed in the surrounding region of the section of the mold member enclosing the light receiving device.

16. The interrupter according to claim 15, further comprising:
an opaque resin buried in the groove.

17. The interrupter according to claim 15, wherein a plurality of the grooves are formed, and the groove located closer to the light receiving device has a larger depth.

18. The interrupter according to claim 12, further comprising:
a light shaping member made of an opaque material, not intervening in the optically shortest light path, and intervening in at least part of a light path other than the optically shortest light path.

19. The interrupter according to claim 12, further comprising:
a transparent section shaped like a hemisphere and enclosing the light emitting device or the light receiving device.

20. The interrupter according to claim 12, further comprising:
a support member made of an opaque material,
wherein the section of the mold member enclosing the light emitting device is spaced from the section of the mold member enclosing the light receiving device, and the section enclosing the light emitting device is connected to one end of the support member, and the section enclosing the light receiving device is connected to the other end of the support member.

* * * * *